(12) United States Patent
Moriwaki

(10) Patent No.: US 6,836,005 B2
(45) Date of Patent: Dec. 28, 2004

(54) SEMICONDUCTOR DEVICE

(75) Inventor: Shohei Moriwaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/628,462

(22) Filed: Jul. 29, 2003

(65) Prior Publication Data
US 2004/0159926 A1 Aug. 19, 2004

(30) Foreign Application Priority Data
Feb. 14, 2003 (JP) .......................................... 2003-036931

(51) Int. Cl.⁷ .............................................. H01L 23/02
(52) U.S. Cl. ...................... 257/678; 257/691; 257/706; 257/712; 257/718; 257/719; 257/726; 361/712; 361/714
(58) Field of Search ................................ 257/678, 691, 257/706, 712, 718, 719, 726; 361/712, 714

(56) References Cited
U.S. PATENT DOCUMENTS 5,920,119 A * 7/1999 Tamba et al. ............... 257/718
6,282,095 B1 * 8/2001 Houghton et al. .......... 361/704
6,512,675 B1 * 1/2003 Tarter et al. ................ 361/714

FOREIGN PATENT DOCUMENTS

| JP | 11-145322 | 5/1999 | |
| JP | 11-204679 | 7/1999 | |
| JP | 11204679 A * | 7/1999 | ........... H01L/23/12 |

* cited by examiner

Primary Examiner—Tom Thomas
Assistant Examiner—Matthew E. Warren
(74) Attorney, Agent, or Firm—McDermott Will & Emery LLP

(57) ABSTRACT

A semiconductor device includes a semiconductor package, a substrate provided under the semiconductor package, a metal substrate provided on the semiconductor package, and a fixing member positioning the semiconductor package and the metal substrate on the substrate. The substrate is provided with a hole passing though the substrate. A portion of the fixing member is inserted into the hole and a tip of the fixing member contacts a fourth terminal. Semiconductor package has a first main surface, a second main surface provided opposite to the first main surface, and a first terminal provided at the first main surface.

3 Claims, 4 Drawing Sheets

SEMICONDUCTOR DEVICE

BACKGROUND OF THE INVENTION

1. Field of the Invention

The present invention generally relates to a semiconductor device. More particularly, the present invention relates to a semiconductor device with a semiconductor package.

2. Description of the Background Art

A conventional semiconductor device with a semiconductor package is disclosed, for example, in Japanese Patent Laying-Open No. 11-204679.

In the semiconductor device disclosed in the above document, a semiconductor chip has an upper surface with a plurality of power-supply signal lines for providing a power supply and has a lower surface with a plurality of electrodes for a signal for exchanging signals. The semiconductor chip is enclosed in a package. A power supply interconnection line formed externally to the package contacts an electrode for a power supply and a printed circuit board.

Such a semiconductor device has a problem that the power supply interconnection line tends to peel off the printed circuit board easily, resulting in deterioration of the reliability of the semiconductor device.

SUMMARY OF THE INVENTION

The present invention is made to solve the problem as described above. An object of the present invention is to provide a highly reliable semiconductor device.

A semiconductor device in accordance with the present invention includes a semiconductor package, a substrate, a metal substrate, and a metal fixing member. The semiconductor package has a first main surface, a second main surface provided opposite to the first main surface, a first terminal provided at the first main surface, a second terminal provided at the second main surface, and a semiconductor element. The substrate has a third main surface opposing the first main surface, a fourth main surface provided opposite to the third main surface, a third terminal contacting the first terminal, and a fourth terminal provided at the fourth main surface. The metal substrate has a fifth main surface opposing the second main surface and electrically connected to the second terminal, and a sixth main surface provided opposite to the fifth main surface. The fixing member contacts the sixth main surface to position the metal substrate. The substrate is provided with a hole passing through the substrate. A portion of the fixing member is inserted into the hole, and a tip of the fixing member contacts the fourth terminal.

In the semiconductor device configured as described above, a portion of the metal member is inserted into the hole, and the tip of the metal member contacts the fourth terminal. As a result, the tip of the metal member presses against the fourth main surface provided with the fourth terminal. In addition, another portion of the fixing member presses against the third main surface of the substrate via the metal substrate and the semiconductor package. As a result, the metal substrate, the semiconductor package, and the substrate are sandwiched together by the metal fixing member. Accordingly, a separation of the fixing member from the substrate can be prevented. Consequently, a highly reliable semiconductor device can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
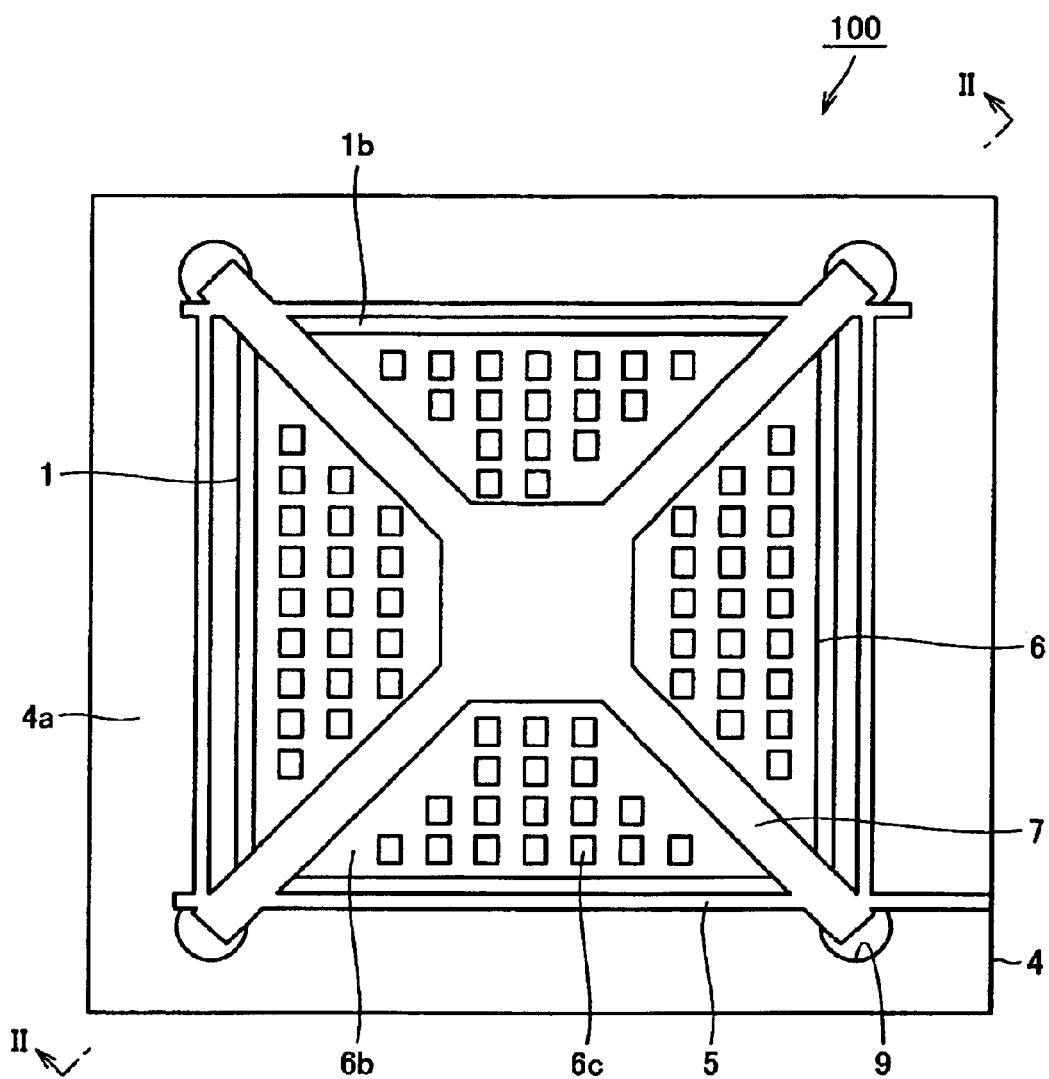
FIG. 1 is a plan view of a semiconductor device in accordance with a first embodiment of the present invention.

In the following, embodiments of the present invention will be described with reference to the drawings. In the following embodiments, the same reference numerals will be assigned to the same or corresponding portions, and description thereof will not be repeated.

First Embodiment

With reference to FIG. 1, a semiconductor device 100 in accordance with a first embodiment of the present invention has a substrate 4. Substrate 4 is approximately cuboid in shape (a square shape in FIG. 1) and has an approximately rectangular plane shape. Substrate 4 has a third main surface 4a.

Via holes 9 are provided at four corners of substrate 4. Distances between neighboring via holes 9 are almost the same. Therefore, lines joining four via holes 9 make a figure that is approximately square.

A semiconductor package 1 is provided on third main surface 4a. Semiconductor package 1 includes a semiconductor element (not shown in FIG. 1) and functions as a core of the semiconductor device. On a second main surface 1b of semiconductor package 1, a metal substrate 6 is provided as a heat radiation board for cooling. Metal substrate 6 is slightly smaller than semiconductor package 1 in plane shape. On a sixth main surface 6b of metal substrate 6, a plurality of fins 6c for heat radiation are provided. Fin 6c increases a surface area of metal substrate 6 and radiates heat from semiconductor package 1. These fins 6c are spaced apart such that they do not contact with each other.

A metal fixing member 7 (a fixing metal tool) is provided to cover metal substrate 6. Fixing member 7 is provided such that it does not contact fin 6c. A portion of fixing member 7 is inserted into via hole 9. Then, the portion of fixing member 7 engages substrate 4, thereby metal substrate 6 and semiconductor package 1 on substrate 4 can be fixed.

Figure 2:
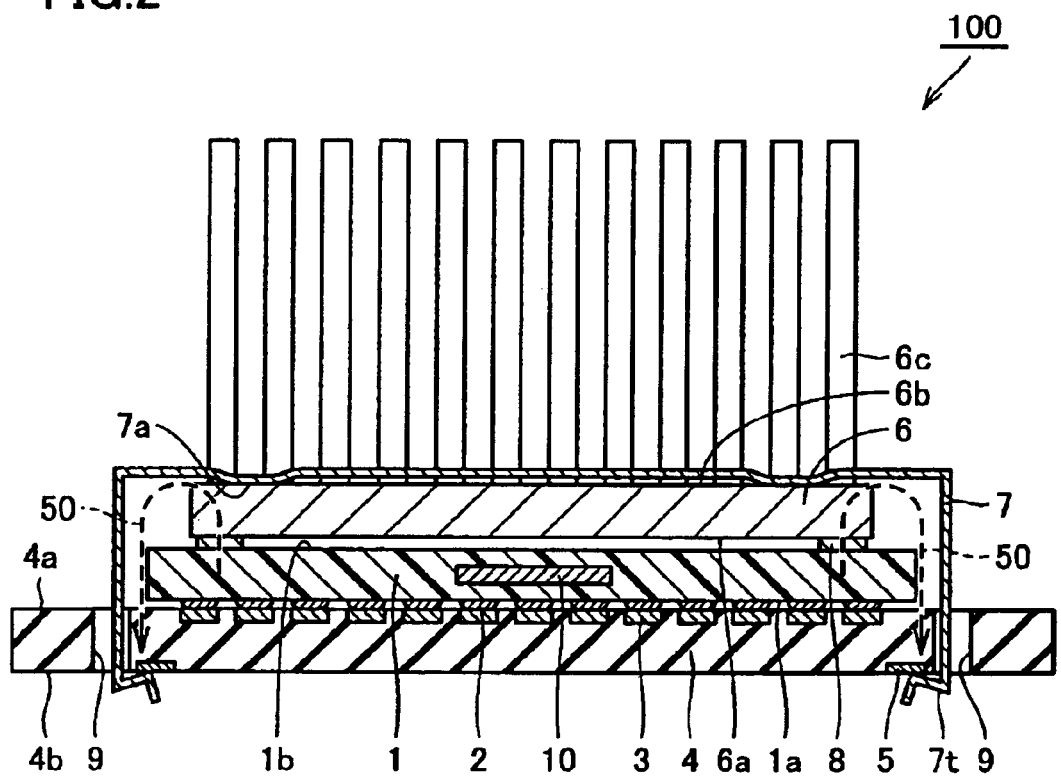
FIG. 2 is a cross-sectional view cut along the line II—II in FIG. 1.

With reference to FIG. 2, semiconductor device 100 in accordance with the first embodiment of the present invention includes semiconductor package 1, substrate 4, metal substrate 6, and fixing member 7. Semiconductor package 1 has a first main surface 1a, second main surface 1b provided opposite to first main surface 1a, a first terminal (a ball terminal) 2 provided at first main surface 1a, a second terminal 8 provided at second main surface 1b, and a semiconductor element 10. Second terminal 8 is a power supply terminal or a ground terminal.

Substrate 4 serving as a host substrate has third main surface 4a opposing first main surface 1a, a fourth main surface 4b provided opposite to third main surface 4a, a third terminal 3 provided at third main surface 4a and connected to first terminal 2, and a fourth terminal 5 provided at fourth main surface 4b. Third terminal 3 is an interconnection line for junction. Fourth terminal 5 is an interconnection line for providing a power supply.

Metal substrate 6 serving as a heat radiation board for cooling has a fifth main surface 6a opposing second main surface 1b and electrically connected to second terminal 8, and sixth main surface 6b provided opposite to fifth main surface 6a. Metal fixing member 7 contacts sixth main surface 6b to position metal substrate 6.

Substrate 4 has via hole 9 serving as a through hole passing through substrate 4. A portion of fixing member 7 is inserted into via hole 9. A tip 7t of fixing member 7 contacts fourth terminal 5.

Substrate 4 is in a shape of a flat plate and has its ends provided with a plurality of via holes 9. A plurality of fourth terminals 5 serving as interconnection lines for providing power supply are arranged adjacently to via holes 9. On the side opposite to fourth terminal 5, a plurality of third terminals 3 are provided as interconnection lines for junction. Third terminal 3 is exposed from third main surface 4a of substrate 4.

Semiconductor package 1 is provided such that it is stacked on substrate 4. Each first terminal 2 provided at semiconductor package 1 as a ball terminal contacts third terminal 3. As a result, third terminal 3 and first terminal 2 are electrically connected. Within semiconductor package 1, semiconductor element 10 as a semiconductor chip is provided. Semiconductor element 10 is electrically connected to first terminal 2. Furthermore, semiconductor element 10 is electrically connected to second terminal 8 provided opposite to first terminal 2. In FIG. 2, second terminal 8 has a power supply potential. Semiconductor element 10 is molded by an organic material constituting semiconductor package 1 and protected from moisture or an external pressure or the like.

Metal substrate 6 serving as a heat radiation board for cooling is stacked on semiconductor package 1. Metal substrate 6 for heat radiation is constituted of a metal with a light weight and a high thermal conductivity such as aluminium. Metal substrate 6 directly contacts second terminal 8. On the side of sixth main surface 6b of metal substrate 6, a plurality of fins 6c are provided. Fins 6c each extend in a direction away from metal substrate 6 and increase a surface area of metal substrate 6. Accordingly, fin 6c radiates heat from semiconductor package 1.

Fixing member 7 is constituted of a metal with a light weight, a high thermal conductivity, and a high electrical conductivity, such as aluminium. Fixing member 7 is elastic and has its tip 7t contacting fourth terminal 5. A protrusion 7a of fixing member 7 contacts metal substrate 6. As a result, substrate 4, semiconductor package 1, and metal substrate 6 are sandwiched together by fixing member 7. As shown by broken lines 50, a current is supplied from second terminal 8, via metal substrate 6 and fixing member 7, to fourth terminal 5.

Figure 3:
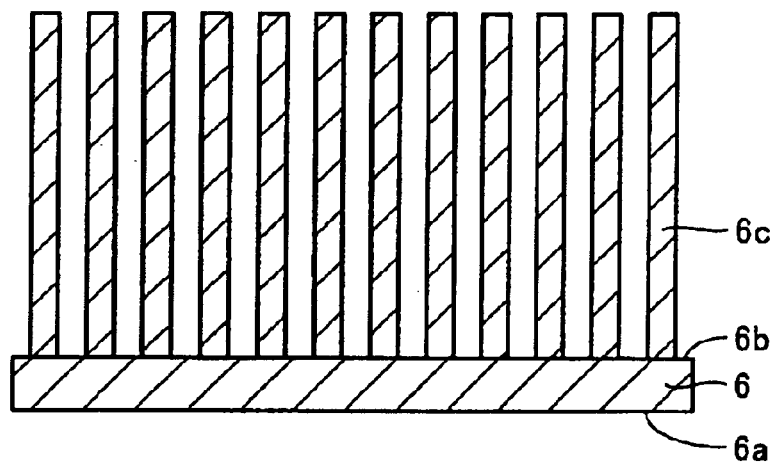
FIG. 3 is a cross-sectional view of a metal substrate.

With reference to FIG. 3, metal substrate 6 has fifth and sixth main surfaces 6a and 6b approximately parallel to each other. A plurality of fins 6c extend in a direction almost normal to a direction in which sixth main surface 6b extends. Fins 6c are arranged with a prescribed space therebetween. Various materials may be employed for metal substrate 6, however, conductivity is necessary. Metal substrate 6 may have different materials in different portions thereof.

In FIG. 3, conductive paste is applied to portions of metal substrate 6 that contact fixing member 7 and second terminal 8 so that a reliable contact is ensured.

Figure 4:
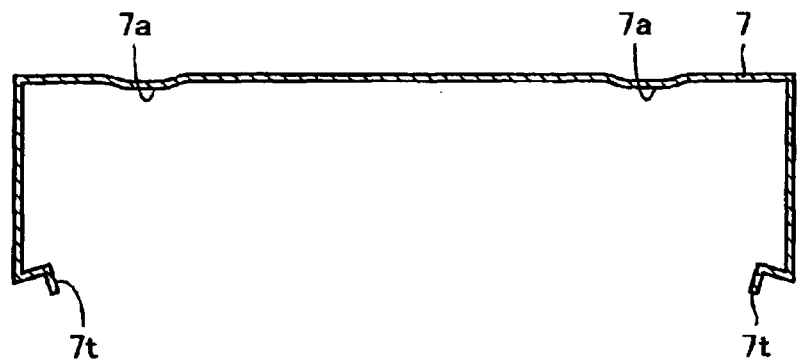
FIG. 4 is a cross-sectional view of a fixing member.

With reference to FIG. 4, fixing member 7 has protrusion 7a and tip 7t. Protrusion 7a is a portion contacting sixth main surface 6b of metal substrate 6. This protrusion 7a presses against metal substrate 6.

Tip 7t is a portion directly contacting fourth terminal 5 and presses against fourth terminal 5 and substrate 4. Protrusion 7a is also electrically connected to sixth main surface 6b of metal substrate 6. Tip 7t is electrically connected to fourth terminal 5.

Conductive paste is applied to, among portions of fixing member 7, protrusion 7a contacting metal substrate 6 and tip 7t contacting fourth terminal 5 so that a better contact is realized.

Figure 5:
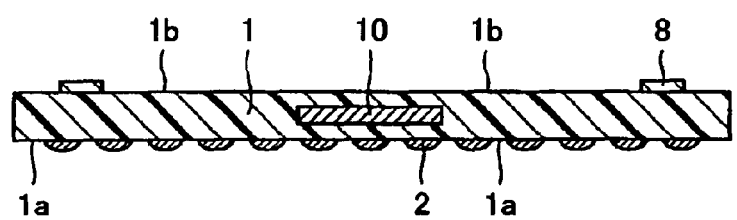
FIG. 5 is a cross-sectional view of a semiconductor package.

With reference to FIG. 5, semiconductor package 1 has semiconductor element 10. Semiconductor element 10 is molded by resin. First terminal 2 and second terminal 8 are electrically connected to semiconductor package 1. Each first terminal 2 inputs and outputs an electrical signal to/from semiconductor element 10. Therefore, first terminal 2 and semiconductor element 10 are electrically connected by an interconnection line (not shown). Second terminal 8 is also electrically connected to semiconductor element 10 by an interconnection line (not shown). It is noted that the potential of second terminal 8 can be set to various potentials such as a power supply potential, a ground potential, and other potentials.

Conductive paste is applied to ball-shaped first terminal 2 and second terminal 8 among portions of the semiconductor package so that their better contacts with another member can be achieved.

Figure 6:
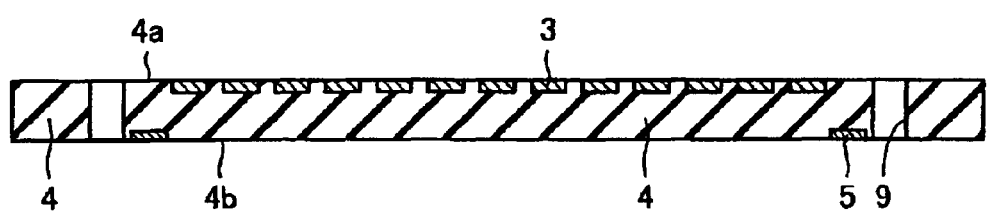
FIG. 6 is a cross-sectional view of a substrate.

With reference to FIG. 6, substrate 4 has a plurality of via holes 9. Via hole 9 passes through substrate 4 and receives fixing member 7 shown in FIG. 4. Fourth terminal 5 is provided at a portion internal to via hole 9. Fourth terminal 5 is provided at fourth main surface 4b of substrate 4. At third main surface 4a opposite to fourth main surface 4b, a plurality of third terminals 3 serving as a plurality of interconnection lines for junction are arranged with a prescribed space therebetween.

In the above-described semiconductor device in accordance with the first embodiment, substrate 4, semiconductor package 1, and metal substrate 6 are sandwiched together by fixing member 7. As a result, semiconductor package 1 and metal substrate 6 are not separated from substrate 4, thereby a highly reliable semiconductor device can be provided.

In addition, fixing member 7 fixing semiconductor package 1 and metal substrate 6 to substrate 4 electrically connects second terminal 8 and fourth terminal 5. Therefore, fixing member 7 plays two roles, i.e. a role as a fixture tool and a role as an interconnection line. Thus, there is no need for increasing the number of components forming the semiconductor device.

The semiconductor device in accordance with the first embodiment can be applied to a multi-pin package such as a ball-grid array (BGA) to have power supply terminals or ground terminals provided at four corners on an upper surface of the semiconductor package. The power supply terminal or the ground terminal can be connected, through metal substrate 6 serving as a heat sink for cooling and its fixing metal tool, i.e., fixing member 7, to fourth terminal 5 that is a ground terminal or a power supply terminal at substrate 4, and accordingly stable power supply potential or ground potential can be supplied. In addition, no power supply terminal or no ground terminal needs to be allocated to first terminal 2 that is a ball terminal. Therefore, a signal line can be allocated to first terminal 2. As a result, in a device particularly with high power consumption, a downsizing of a package or a package of more signal lines in a single semiconductor device is achieved.

Second Embodiment

Figure 7:
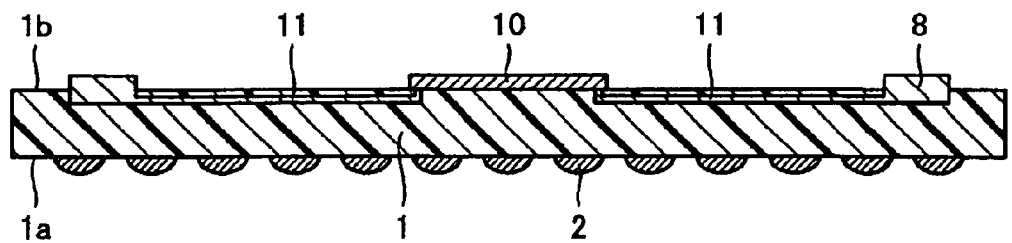
FIG. 7 is a cross-sectional view of a semiconductor package employed in a semiconductor device in accordance with a second embodiment of the present invention.

With reference to FIG. 7, semiconductor package 1 includes first terminal 2 provided at first main surface 1a, second terminal 8 provided at second main surface 1b, semiconductor element 10 provided on second main surface 1b, and an interconnection line 11 connecting semiconductor element 10 and second terminal 8.

In semiconductor package 1 shown in FIG. 7, a power supply potential or a ground potential from second terminal 8 at one of four corners of semiconductor package 1 is supplied, via interconnection line 11 inside semiconductor package 1, to semiconductor element 10. The semiconductor package in FIG. 7 is a semiconductor device packaged in a flip chip scheme.

The semiconductor device in accordance with a second embodiment has an effect similar to that of the semiconductor device in accordance with the first embodiment. In addition, in the flip chip type semiconductor package, through the provision of the power supply terminal or the ground terminal at four corners on the upper surface of the package, no power supply potential or no ground potential needs to be allocated to first terminal 2 on the opposite side, that is a ball terminal. As a result, a signal line can be allocated to first terminal 2. Therefore, in a device particularly with high power consumption, a downsizing of a package or a package of more signal lines in a single package is achieved.

Conductive paste for improving a contact is applied to the power supply terminal or the ground terminal on semiconductor package 1 and the underside of the semiconductor device. As a result, it is possible to ensure a reliable contact between the power supply terminal or the ground terminal and the metal substrate serving as a heat radiation board. Furthermore, when a ground potential is to be supplied to semiconductor element 10, a potential of substrate 4 can be supplied to first terminal 2. Accordingly, an operation of semiconductor element 10 can be stabilized. In addition, through the equalization of heights of second terminals 8 provided at four corners of semiconductor package 1 and semiconductor element 10 provided on semiconductor package 1, a reduction of stress applied to semiconductor element 10 upon mounting of metal substrate 6 can be achieved. Consequently, semiconductor element 10 can be protected.

Third Embodiment

Figure 8:
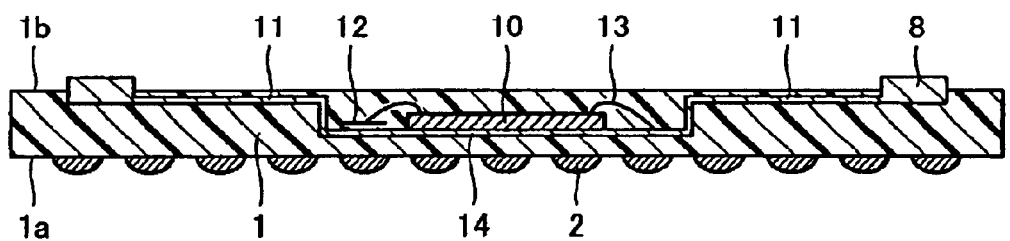
FIG. 8 is a cross-sectional view of a semiconductor package employed in a semiconductor device in accordance with a third embodiment of the present invention.

With reference to FIG. 8, semiconductor package 1 in accordance with a third embodiment of the present invention includes first terminal 2 provided at first main surface 1a as a ball terminal, second terminals 8 provided at four corners of semiconductor package 1 as a power supply terminal or a ground terminal, semiconductor element 10 packaged on the semiconductor package by a wire bonding process, interconnection line 11 provided inside semiconductor package 1 for supplying a power supply potential or a ground potential, a wire for a signal line 12 connected to semiconductor element 10, a wire 13 supplying a power supply potential or a ground potential to semiconductor element 10, and a die pad 14 fixing semiconductor element 10 to semiconductor package 1 and supplying a substrate potential.

In semiconductor package 1 in FIG. 8, a power supply potential or a ground potential from second terminal 8 at one of four corners on second main surface 1b of semiconductor package 1 is supplied, via interconnection line 11 within semiconductor package 1 for supplying a power supply potential or a ground potential and via wire 13 for a power supply potential or a ground potential connected to semiconductor element 10, to semiconductor element 10.

The semiconductor device employing the semiconductor package configured in accordance with the third embodiment has an effect similar to that of the semiconductor device in accordance with the first embodiment.

In addition, in the wire bonding type semiconductor package 1, through the provision of second terminal 8, which is a terminal for a power supply or a ground or the like, at four corners on an upper surface of semiconductor package 1, no power supply terminal or no ground terminal needs to be allocated to first terminal 2 that is a ball terminal. As a result, a signal line can be allocated to first terminal 2 on the underside. Therefore, in a device particularly with high power consumption, a downsizing of a package or a package of more signal lines within single semiconductor package 1 is achieved. In addition, conductive paste for improving a contact is applied to second terminal 8 of semiconductor package 1 for a power supply or a ground. As a result, it is possible to ensure a reliable contact between second terminal 8 for a power supply potential or a ground potential and metal substrate 6.

In accordance with the present invention, a reliable electrical connection can be ensured, thereby a highly reliable semiconductor device can be provided.

Although the present invention has been described and illustrated in, detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor package including a first main surface, a second main surface provided opposite to the first main surface, a first terminal provided at said first main surface, a second terminal provided at said second main surface, and a semiconductor element;

a substrate having a third main surface opposing said first main surface, a fourth main surface provided opposite to said third main surface, a third terminal contacting said first terminal, and a fourth terminal provided at said fourth main surface;

a metal substrate having a fifth main surface opposing said second main surface and electrically connected to said second terminal and a sixth main surface provided opposite to said fifth main surface; and a metal fixing member contacting said sixth main surface to position said metal substrate, said substrate being provided with a hole passing through said substrate, and a portion of said fixing member being inserted into said hole, and a tip of said fixing member contacting said fourth terminal.

2. The semiconductor device according to claim 1, wherein said semiconductor package is a flip chip type semiconductor package.

3. The semiconductor device according to claim 1, wherein said semiconductor package is a wire bonding type semiconductor package.

* * * * *